(12) United States Patent  
Chey et al.

(10) Patent No.: US 8,949,040 B2
(45) Date of Patent: Feb. 3, 2015

(54) METHODS AND APPARATUS FOR MANAGING CORROSION IN BUILDINGS

(75) Inventors: S. Jay Chey, Ossining, NY (US); Hendrik F. Hamann, Yorktown Heights, NY (US); Levente Ioan Klein, Tuckahoe, NY (US); Michael Alan Schappert, Wappingers Falls, NY (US); Andriy Stepanchuk, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 639 days.

(21) Appl. No.: 13/222,953

(22) Filed: Aug. 31, 2011

(65) Prior Publication Data

US 2013/0047547 A1    Feb. 28, 2013

(51) Int. Cl.
*G01B 3/44* (2006.01)
*H05K 7/20* (2006.01)
*F24F 11/00* (2006.01)

(52) U.S. Cl.
CPC ......... *H05K 7/20745* (2013.01); *F24F 11/0009* (2013.01); *F24F 2011/0006* (2013.01)
USPC .......................................................... 702/34

(58) Field of Classification Search
CPC combination set(s) only.
See application file for complete search history.

(56) References Cited

U.S. PATENT DOCUMENTS

| | | | |
|---|---|---|---|
| 7,231,318 B2 * | 6/2007 | Kihira et al. | 702/184 |
| 7,704,371 B2 | 4/2010 | Meyer et al. | |
| 7,794,583 B2 * | 9/2010 | Lyublinski | 205/724 |
| 2010/0123583 A1 * | 5/2010 | Bommer et al. | 340/572.7 |

FOREIGN PATENT DOCUMENTS

| | | |
|---|---|---|
| GB | 2121212 A | 12/1983 |
| JP | 2007240481 A2 | 9/2007 |

OTHER PUBLICATIONS

O. Hahin, "Predicting the Metallic Corrosion Costs of Operating and Maintaining Buildings and Utility Systems," Materials Performance, Sep. 1978, pp. 31-34, vol. 17, No. 9, National Association of Corrosion Engineers.

X.G. Zhang, "Zinc Coating Life Prediction: Definitions," http://www.galyinfo.com:8080/zclp/Definition.htm, International Zinc Association.

Prosource Technical Services, LLC, http://www.team-prosource.com/.

Serverfault, http://serverfault.comiquestions/6000/ideal-humidity-for-a-server-room.

W.B.A. Sharp, "Protection of Control Equipment from Atmospheric Corrosion," Corrosion 90, Apr. 1990, Paper No. 392, NACE International.

\* cited by examiner

*Primary Examiner* — Elias Desta
(74) *Attorney, Agent, or Firm* — Daniel P. Morris, Esq.; Otterstedt, Ellenbogen & Kammer, LLP (57) ABSTRACT

Principles of the invention provide methods and apparatus for providing corrosion management in buildings. In one aspect, an exemplary method includes the step of receiving first data relating corrosion rate to a plurality of environmental conditions. This first data is subsequently utilized to determine a quantitative relationship between corrosion rate and the plurality of environmental conditions. In another step, second data indicative of one or more environmental conditions within a building is received. A corrosion rate in the building is then determined at least in part by applying the determined quantitative relationship to this second data.

19 Claims, 4 Drawing Sheets

METHODS AND APPARATUS FOR MANAGING CORROSION IN BUILDINGS

STATEMENT REGARDING FEDERALLY SPONSORED RESEARCH OR DEVELOPMENT

This invention was made with Government support under Contract No.: DE-EE00002897 awarded by the Department of Energy. The Government has certain rights in this invention.

FIELD OF THE INVENTION

The present invention relates generally to the electrical, electronic, environmental control, preservation, and computer arts, and, more particularly, to methods and apparatus for managing corrosion in buildings.

BACKGROUND OF THE INVENTION

The environmental conditions (e.g., air flow, temperature, humidity, etc.) within energy intensive facilities like data centers, telecommunications centers, clean rooms, and hospitals must frequently be strictly regulated in order to maintain productivity and reliable operability. In the past, much of this environmental regulation has been accomplished solely through air conditioning. Nevertheless, as energy prices and the heat generated by equipment have continued to increase, there has been a trend towards using outside air to aid in cooling buildings containing these types of facilities.

An "air-side economizer system" may serve as a control mechanism to regulate the use of outside air for cooling a building. Such an economizer system utilizes an arrangement of sensors, ducts, and dampers to allow an appropriate volume of outside air to enter a building and aid in cooling. The sensors measure the outside and inside air conditions. If outside conditions are suitable for cooling, the economizer system adjusts its dampers to introduce the outside air into the space. This, in turn, may reduce the need for air conditioning, which may result in significant energy savings.

Nevertheless, using outside air to cool energy intensive facilities is not without issues. Using outside air to cool a building may introduce gaseous or particulate contamination into that building, which may have an adverse effect on electronic components, circuits, and other sensitive systems. Under some environmental conditions, for example, dust deposited on electronic parts or corrosion of metal components may occur at a rate high enough to contribute to the premature failure of these systems.

SUMMARY OF THE INVENTION

Principles of the invention provide methods and apparatus for providing corrosion management in buildings. In one aspect, an exemplary method includes the step of receiving first data relating corrosion rate to a plurality of environmental conditions. This first data is subsequently utilized to determine a quantitative relationship between corrosion rate and the plurality of environmental conditions. In another step, second data indicative of one or more environmental conditions within a building is received. A corrosion rate in the building is then determined at least in part by applying the determined quantitative relationship to this second data.

One or more embodiments of the invention or elements thereof can be implemented in the form of a computer program product including a computer readable storage medium with computer usable program code for performing the method steps indicated. Furthermore, one or more embodiments of the invention or elements thereof can be implemented in the form of a system (or apparatus) including a memory, and at least one processor that is coupled to the memory and operative to perform exemplary method steps. Yet further, in another aspect, one or more embodiments of the invention or elements thereof can be implemented in the form of means for carrying out one or more of the method steps described herein; the means can include (i) hardware module(s), (ii) software module(s) stored in a computer readable storage medium (or multiple such media) and implemented on a hardware processor, or (iii) a combination of (i) and (ii); any of (i)-(iii) implement the specific techniques set forth herein. Techniques of the present invention can provide substantial beneficial technical effects. For example, one or more embodiments may provide the ability to determine and forecast localized corrosion rates in a building, ultimately allowing the more effective and efficient management of that building.

BRIEF DESCRIPTION OF THE DRAWINGS

These and other features, aspects, and advantages of the present invention will become better understood with regard to the following description, appended claims, and accompanying drawings where:

DETAILED DESCRIPTION OF THE INVENTION

The present invention will be described with reference to illustrative embodiments. For this reason, numerous modifications can be made to these embodiments and the results will still come within the scope of the invention. No limitations with respect to the specific embodiments described herein are intended or should be inferred.

Figure 1:
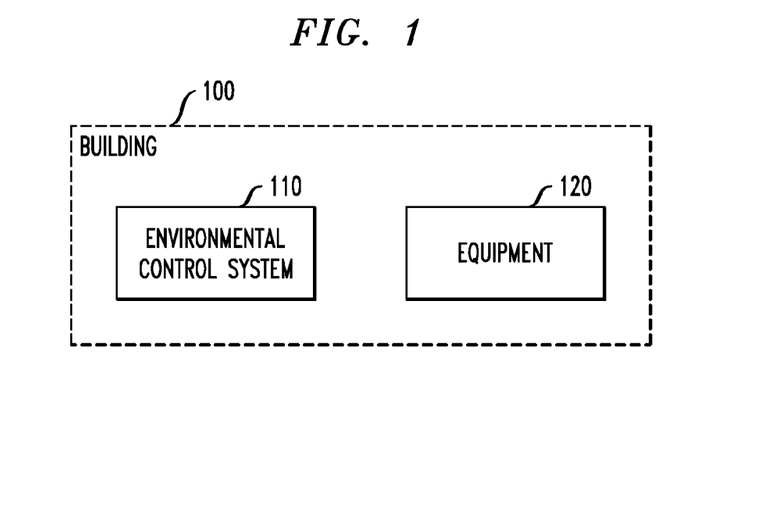
FIG. 1 shows a block diagram of a building in accordance with an illustrative embodiment of the invention.

FIG. 1 shows a block diagram of elements within a building 100 in accordance with an illustrative embodiment of the invention. The building 100 may, for example, house an energy intensive facility such as a data center, a telecommunications center, a clean room, a hospital, or the like. More generally, the building comprises an environmental control system (ECS) 110 and equipment 120. For purposes of describing aspects of the invention, it will be assumed that equipment 120 in the building 100 requires cooling to function properly.

Figure 2:
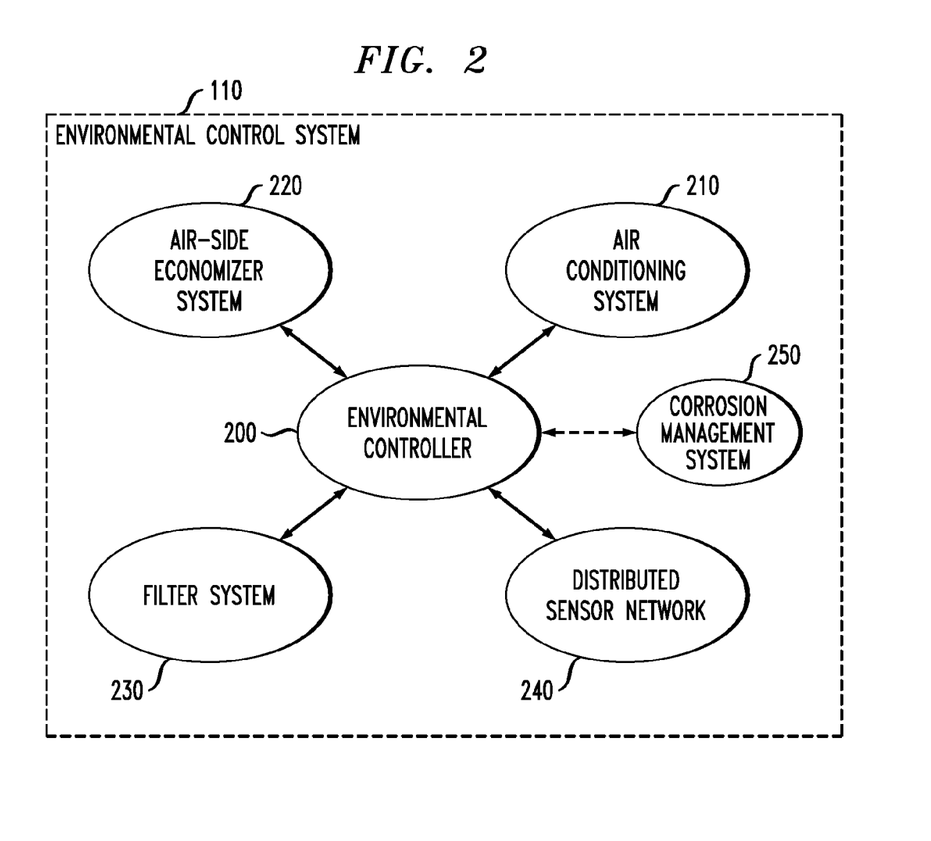
FIG. 2 shows a block diagram of an environmental control system that may be used within the FIG. 1 building, in accordance with an illustrative embodiment of the invention.

FIG. 2 goes on to show a block diagram of several components within the ECS 110, in accordance with an illustrative embodiment of the invention. The ECS 110 may comprise an environmental controller 200 that may act to regulate an air conditioning system 210, an air-side economizer system 220, and a filter system 230. This regulation is performed at least in part in response to signals generated by a distributed sensor network 240. The ECS 110 may also receive inputs generated by a corrosion management system (CMS) 250. Depending on the particular configuration, the environmental controller 200 may receive signals directly from the CMS 250 or, alternatively or in addition, a human operator may provide inputs into the environmental controller 200 based on results generated by the CMS 250.

Figure 3:
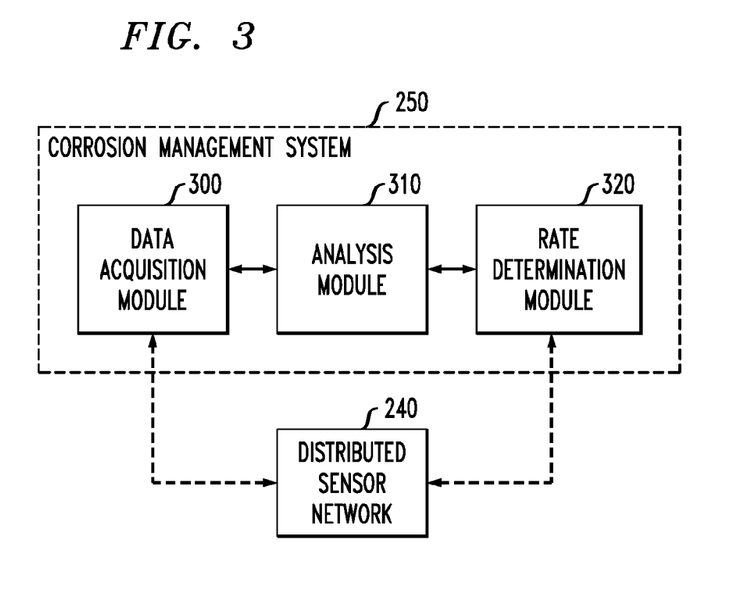
FIG. 3 shows a block diagram of a corrosion management system that may be used within the FIG. 1 building, in accordance with an illustrative embodiment of the invention.

Aspects of the CMS 250 are shown in FIG. 3, which shows a block diagram of several elements that may be found within the CMS 250 according to an illustrative embodiment of the invention. For ease of understanding, the exemplary CMS 250 may be divided into several modules: a data acquisition module 300, an analysis module 310, and a rate determination module 320. Each module 300, 310, 320 may serve one or more functions in managing corrosion within the building 100. As will be detailed below, the CMS 250 may be implemented in hardware, in software, or in a combination thereof.

As further indicated in FIG. 3, the data acquisition module 300 and the rate determination module 320 may receive information from the distributed sensor network 240. In a manner similar to the communication between the environmental controller 200 and the CMS 250, the data acquisition module 300 and rate determination module 320 may receive signals directly from one or more of the sensors in the distributed sensor network 240, or, alternatively or in addition, a human operator may provide inputs into these modules 300, 320 based on measurements made by one or more of the sensors. The distributed sensor network 240 may include, for example, air flow sensors, temperature sensors, humidity sensors, corrosion rate sensors, and gas concentration sensors. These sensors will preferably be distributed about the building 100 in order to measure localized variations in environmental conditions therein.

Sensors operative to measure air flow, temperature, humidity, and gas concentrations are commercially available and will, as a result, be already familiar to one skilled in the art. The corrosion rate sensors in the distributed sensor network 240 may take on various forms, each of which will fall within the scope of the invention. Because copper and silver films are utilized extensively as contacts in electronic devices, a purpose of the corrosion rate sensors in a building where sensitive electronic devices are supported may be to quantify the rate at which nonconductive corrosion products (e.g., $Cu_2S$ or $Ag_2S$) form on the surfaces of copper and silver films. Gaseous corrosive contaminants responsible for the formation of such nonconductive corrosion products might include, for example, $H_2S$, $SO_2$, $NO_x$ and $Cl_2$.

One type of corrosion rate sensor, for example, might comprise a copper or silver film that is weighed before and after that film is exposed to a particular environment in a building. Such corrosion sensors may be left in a building for several months and may yield an average corrosion rate over that period of exposure. In contrast, another type of corrosion rate sensor may rely on changes in resistance of thin metal film resistors (hereinafter "resistive corrosion sensors") rather than changes in weight. Such resistive corrosion sensors have demonstrated resolutions better than 0.1 nanometer corrosion-product per day. These corrosion rate sensors may provide real-time corrosion measurements and may have enough resolution to assess part-per-billion concentrations of corrosive contaminants.

As just stated, the corrosion rate of a resistive corrosion sensor may be determined by a change in resistance of a thin metal film resistor. The resistance, R, of a thin metal film resistor may be:

$$R = C\frac{\rho}{h},$$

where h is the film thickness, $\rho$ is the resistivity of the metal, and C is a geometrical factor. If the metal film is exposed to a corrosive atmosphere, the resultant corrosion induces a change in h which is measurable as a change in R.

The metal loss rate at constant temperature may then be:

$$\frac{\partial h}{\partial t} = -C\frac{\rho}{R^2}\frac{\partial R}{\partial t},$$

where t is time. This formula may be accurate so long as the length and width of the thin metal film resistor is much larger than its film thickness. The corrosion rate, $R_c$, in turn, may be:

$$R_c = M\frac{\partial h}{\partial t},$$

where M is a correction factor introduced by the chemical composition of the corrosion product that is formed on the metal surface. The correction factor for silver being transformed into $Ag_2S$ may be approximately 1.67, and the correction factor for silver being transformed into $Cu_2S$ may be approximately 2.

The corrosion rate may be measured in various parts of the energy intensive facility, like at the output of an air handling system, the air intakes of servers or other sensitive equipments, and at any other critical locations where the corrosion rate may be important to know. The corrosion rate can vary significantly across a facility and this information can be used to manage the corrosion accordingly.

Figure 4:
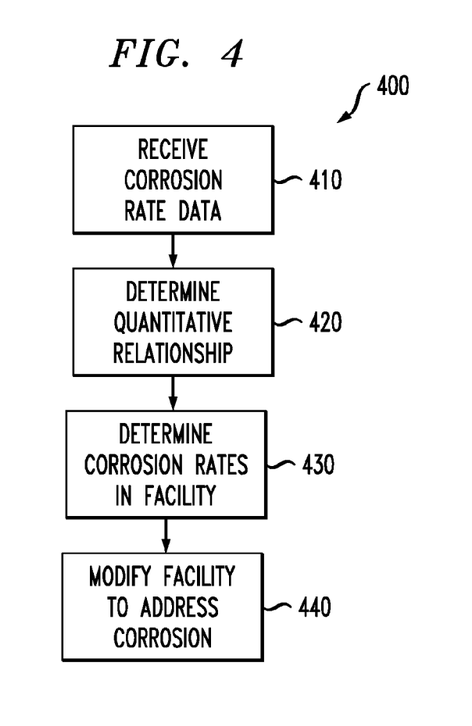
FIG. 4 shows a method for managing corrosion that may be used in the FIG. 1 building, in accordance with an illustrative embodiment of the invention.

FIG. 4 shows a flow diagram of a method 400 for utilizing the CMS 250 to analyze corrosion within the building 100, in accordance with an illustrative embodiment of the invention. In step 410, the data acquisition module 300 of the CMS 250 receives data from the sensors in the distributed sensor network 240 that preferably relate corrosion rate to a plurality of environmental conditions. The plurality of environmental conditions may include, for example, air flow, temperature, humidity, and the concentrations of particulate and gaseous contaminants that may cause corrosion (hereinafter "corrosive contaminant concentrations"). The corrosion rates may be determined by resistive corrosion sensors described earlier, although, again, any other equally suitable sensor may be utilized. The corrosive contaminant concentrations may include, for example, the concentrations of $H_2S$, $SO_2$, $NO_x$ and $Cl_2$. The data is preferably collected from distributed locations within the building 100 so that variations in the above-identified environmental conditions can be readily detected and quantified.

Next, in step 420, the analysis module 310 of the CMS 250 utilizes the data received in step 410 to determine a quantitative relationship between corrosion rate and the plurality of environmental conditions. Any appropriate quantitative relationship that accurately expresses corrosion rate as a function of the relevant environmental conditions may be utilized. A suitable quantitative relationship may, as just one example, relate corrosion rate, $R_c$, to the various environmental factors by the formula:

$$R_c = K[A]^a[T]^b[H]^c[C1]^d[C2]^e[C3]^f[C4]^g,$$

where K is a constant; A is air flow; T is temperature; H is humidity; C1-C4 are the respective concentrations of relevant corrosive contaminants such as $H_2S$, $SO_2$, $NO_R$, and $Cl_2$; and a-g are empirically determined coefficients based on the measurements. Notably, different quantitative relationships are preferably determined for the different metals of interest (e.g., copper and silver) since each metal of interest is likely to have different corrosion kinetics.

Figure 5:
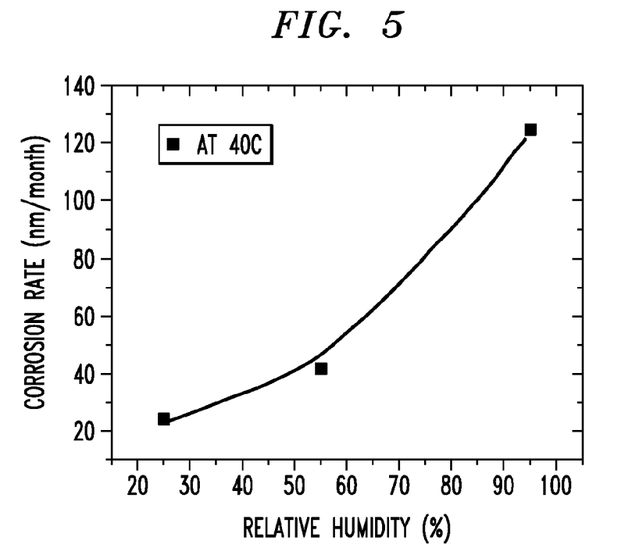
FIG. 5 shows an illustrative chart of corrosion rate versus relative humidity.
Figure 6:
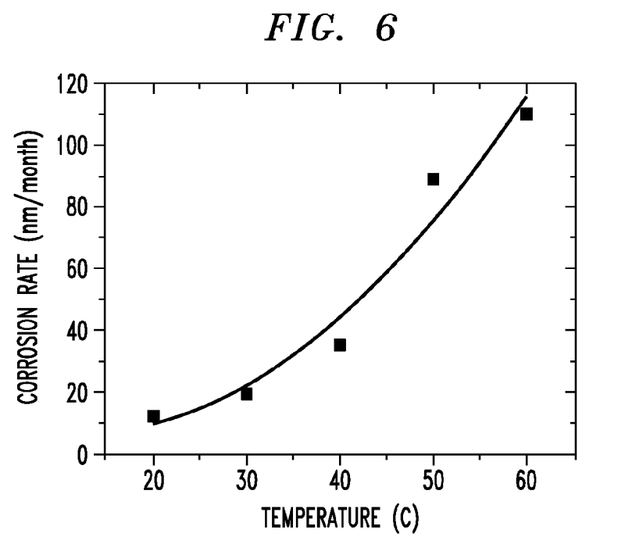
FIG. 6 shows an illustrative chart of corrosion rate versus temperature.

In this manner, what may be referred to as a "neural network model" technique may be applied in step 420 to the data received in step 410 in order to empirically determine a quantitative relationship between corrosion rate and several environmental conditions. Fitting a quantitative relationship to the data received in step 420 may be accomplished using, for example, regression analysis techniques that will be familiar to one skilled in the art. As just an example, FIG. 5 shows an illustrative chart of corrosion rate versus relative humidity for silver at a fixed temperature. This particular data is best fit by a third order polynomial. As another example, FIG. 6 shows a chart of corrosion rate versus temperature for copper in a "sulfur flower" environment at 55% relative humidity. Here a second order polynomial provides the best fit.

With the quantitative relationship determined in step 420, the rate determination module 320 may then, in step 430, calculate corrosion rates at various locations within the building by simply receiving data indicating environmental conditions at those locations from the distributed sensor network 240, and then applying the quantitative relationship to that data. As a result, there may no longer be a need to continue utilizing corrosion sensors to determine corrosion rates, although periodic use of such corrosion sensors is preferable in order to periodically validate the quantitative relationship. Moreover, since experience suggests that the concentrations of corrosive contaminants may remain relatively constant at a particular location in a building because of the mixing and circulating of air, it may even be possible to forego the continued measurement of the corrosive concentrations under certain circumstances and assume they remain constant with little impact on accuracy. The number of environmental conditions that must be continually measured to determine an accurate corrosion rate via the quantitative relationship may thereby be reduced. As an example, the rate determination module 320 may be operative to provide an accurate local corrosion rate based only on local air flow, temperature, and humidity measurements.

Figure 7:
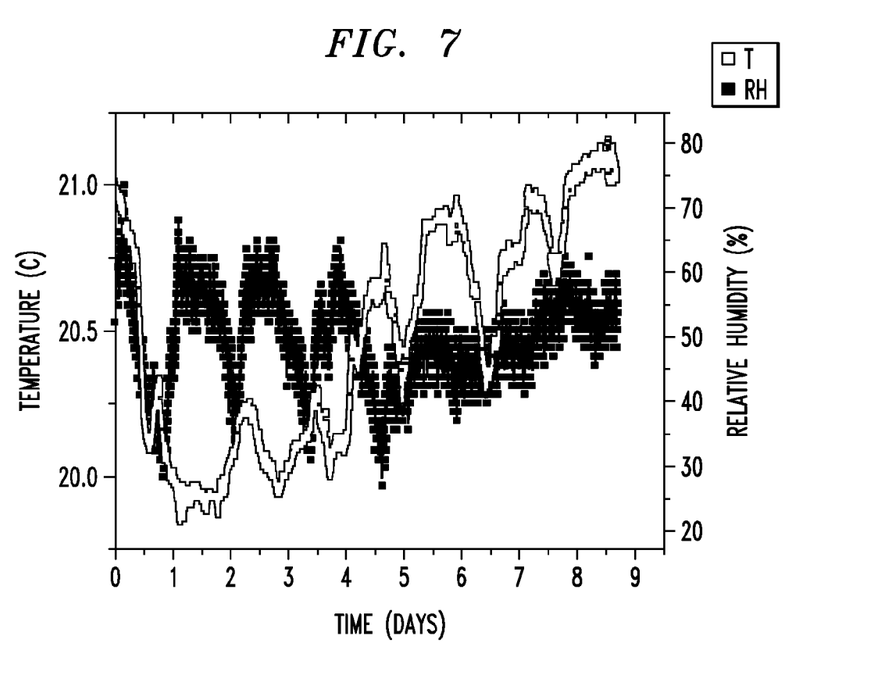
FIG. 7 shows an illustrative chart of temperature and humidity versus time.

Advantageously, the rate determination module 320 may also be utilized to forecast corrosion within the building 100 by determining a time series of corrosion rates in the manner described above, and then extrapolating the determined corrosion rates into the future. In many energy intensive facilities, air flow, temperature, and humidity have repeatable temporal and spatial variations. FIG. 7, for example, shows an illustrative chart of temperature and relative humidity over several days. In this figure, it is clear that both temperature and humidity respond to outside air characteristics. Accordingly, if corrosion rates are determined over a sufficiently long period of time (e.g., several days), extrapolated corrosion levels may be quite accurate when using methods in accordance with aspects of the invention.

Lastly, in step 440, the building 100 may be modified to address the present and forecast corrosion rates determined in step 430. For example, regions with well defined corrosion rates may be delineated in the building 100 and equipment regrouped or clustered into these various regions based on their importance and susceptibility to corrosion. A region may be created in the building 100 with relatively low corrosion rates by selective filtering in order to reduce corrosive contaminants and/or by having the environmental controller 200 modify the mixing ratio of one or more of outdoor/indoor air, air flow, temperature, and humidity. Such a region preferably hosts equipment that is mission critical and/or equipment that may be relatively susceptible to corrosion. At the same time, another region in the same building 100 may be allowed to exist where the environmental conditions are less rigorously controlled and corrosion is more of a risk. The latter region preferably hosts less critical equipment and/or equipment that may be less susceptible to corrosion. In any case, in forming the different regions in such a manner, an operator may consider equipment failure risks versus the energy saved by implementing less restrictive environmental control. The ultimate result is more effective and efficient building management.

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

One or more embodiments of the invention, or elements thereof, can be implemented in the form of an apparatus including a memory and at least one processor that is coupled to the memory and operative to perform exemplary method steps.

Figure 8:
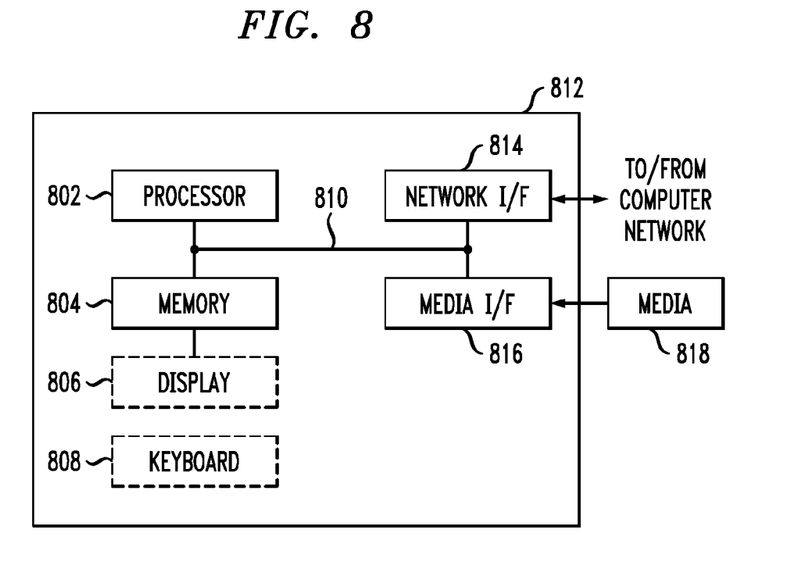
FIG. 8 shows a block diagram of a computer system that may be useful in implementing one or more aspects and/or elements of the invention, in accordance with an illustrative embodiment of the invention.

One or more embodiments can make use of software running on a general purpose computer or workstation. With reference to FIG. 8, such an implementation might employ, for example, a processor 802, a memory 804, and an input/output interface formed, for example, by a display 806 and a keyboard 808. The term "processor" as used herein is intended to include any processing device, such as, for example, one that includes a CPU (central processing unit) and/or other forms of processing circuitry. Further, the term "processor" may refer to more than one individual processor. The term "memory" is intended to include memory associated with a processor or CPU, such as, for example, RAM (random access memory), ROM (read only memory), a fixed memory device (for example, hard drive), a removable memory device (for example, diskette), a flash memory and the like. In addition, the phrase "input/output interface" as used herein, is intended to include, for example, one or more mechanisms for inputting data to the processing unit (for example, mouse), and one or more mechanisms for providing results associated with the processing unit (for example, printer). The processor 802, memory 804, and input/output interface such as display 806 and keyboard 808 can be interconnected, for example, via bus 810 as part of a data processing unit 812. Suitable interconnections, for example via bus 810, can also be provided to a network interface 814, such as a network card, which can be provided to interface with a computer network, and to a media interface 816, such as a diskette or CD-ROM drive, which can be provided to interface with media 818.

Accordingly, computer software including instructions or code for performing the methodologies of the invention, as described herein, may be stored in one or more of the associated memory devices (for example, ROM, fixed or removable memory) and, when ready to be utilized, loaded in part or in whole (for example, into RAM) and implemented by a CPU. Such software could include, but is not limited to, firmware, resident software, microcode, and the like.

A data processing system suitable for storing and/or executing program code will include at least one processor 802 coupled directly or indirectly to memory elements 804 through a system bus 810. The memory elements can include local memory employed during actual implementation of the program code, bulk storage, and cache memories which provide temporary storage of at least some program code in order to reduce the number of times code must be retrieved from bulk storage during implementation.

Input/output or I/O devices (including but not limited to keyboards 808, displays 806, pointing devices, and the like) can be coupled to the system either directly (such as via bus 810) or through intervening I/O controllers (omitted for clarity).

Network adapters such as network interface 814 may also be coupled to the system to enable the data processing system to become coupled to other data processing systems or remote printers or storage devices through intervening private or public networks. Modems, cable modem and Ethernet cards are just a few of the currently available types of network adapters.

As used herein, including the claims, a "server" includes a physical data processing system (for example, system 812 as shown in FIG. 8) running a server program. It will be understood that such a physical server may or may not include a display and keyboard.

As noted, aspects of the present invention may take the form of a computer program product embodied in one or more computer readable medium(s) having computer readable program code embodied thereon. Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. Media block 818 is a non-limiting example. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electromagnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++, or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described herein with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus, or other devices to produce a computer implemented process such that the instructions which execute on the computer or other programmable apparatus provide processes for implementing the functions/acts specified in the flowchart and/or block diagram block or blocks.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

It should be noted that any of the methods described herein can include an additional step of providing a system comprising distinct software modules embodied on a computer readable storage medium; the modules can include, for example, any or all of the elements depicted in the block diagrams and/or described herein; by way of example and not limitation, a data acquisition module, a analysis module, and a rate determination module. The method steps can then be carried out using the distinct software modules and/or sub-modules of the system, as described above, executing on one or more hardware processors 802. Further, a computer program product can include a computer-readable storage medium with code adapted to be implemented to carry out one or more method steps described herein, including the provision of the system with the distinct software modules.

In any case, it should be understood that the components illustrated herein may be implemented in various forms of hardware, software, or combinations thereof; for example, application specific integrated circuit(s) (ASICS), functional circuitry, one or more appropriately programmed general purpose digital computers with associated memory, and the like. Given the teachings of the invention provided herein, one of ordinary skill in the related art will be able to contemplate other implementations of the components of the invention.

The terminology used herein is for the purpose of describing particular embodiments only and is not intended to be limiting of the invention. As used herein, the singular forms "a," "an," and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiments were chosen and described in order to best explain the principles of the invention and the practical application, and to enable others of ordinary skill in the art to understand the invention for various embodiments with various modifications as are suited to the particular use contemplated.

What is claimed is:

1. A method of a corrosion management system for managing corrosion of a piece of equipment disposed in a building, the method comprising the steps of:

receiving first data relating corrosion rate to a plurality of environmental conditions;

determining, by at least one hardware processor of the corrosion management system, a quantitative relationship between corrosion rate and the plurality of environmental conditions from the first data;

receiving, from one or more corrosion sensors of the corrosion management system, second data indicative of one or more environmental conditions within the building;

determining, by the at least one hardware processor of the corrosion management system, a corrosion rate affecting the piece of equipment disposed in the building at least in part by applying the determined quantitative relationship to the second data; and modifying an aspect of an environmental control system of the building at least in part in response to the determined corrosion rate, wherein the environmental control system receives, directly, an input generated by the corrosion management system and regulates the environmental conditions within the building using the input.

2. The method of claim 1, wherein the building comprises an air-side economizer system.

3. The method of claim 1, wherein the first data is collected at least in part by measuring a corrosion rate with the one or more corrosion sensors.

4. The method of claim 3, wherein the one or more corrosion sensors comprise a resistive corrosion sensor.

5. The method of claim 1, wherein the first data is collected at least in part at a plurality of locations within the building.

6. The method of claim 1, wherein the plurality of environmental conditions in the first data comprises at least one of air flow, temperature, humidity, and corrosive contaminant concentration.

7. The method of claim 1, wherein the quantitative relationship comprises one or more quantities raised to a respective one of one or more powers, each of the one or more quantities reflecting a respective environmental condition within the building.

8. The method of claim 1, wherein the step of determining the quantitative relationship comprises applying regression techniques.

9. The method of claim 1, wherein the second data is collected at least in part with the one or more corrosion sensors including at least one of an air flow sensor, a temperature sensor, a humidity sensor, and a gas concentration sensor.

10. The method of claim 1, wherein the step of modifying an aspect of the building comprises modifying a mixing ratio between inside air and outside air in the building.

11. The method of claim 1, further comprising the step of modifying an aspect of the environmental control system of the building at least in part in response to the determined corrosion rate, wherein the step of modifying an aspect of the building further comprises adding a filter to the building.

12. The method of claim 1, wherein the step of modifying an aspect of the building comprises modifying at least one of air flow, temperature, and humidity in the building.

13. The method of claim 1, further comprising the step of modifying an aspect of the environmental control system of the building at least in part in response to the determined corrosion rate, wherein the step of modifying an aspect of the building further comprises moving the piece of equipment within the building.

14. The method of claim 1, further comprising forecasting future corrosion within the building at least in part based on the provided corrosion rate.

15. The method of claim 1, further comprising providing the corrosion management system, wherein the corrosion management system comprises distinct software modules, each of the distinct software modules being embodied on a computer-readable storage medium, and wherein the distinct software modules comprise a data acquisition module, an analysis module, and a rate determination module, wherein:
- the step of receiving the first data is carried out by the data acquisition module executing on the at least one hardware processor;
- the step of determining the quantitative relationship is carried out by the analysis module executing on the at least one hardware processor; and
- the steps of receiving the second data and providing the corrosion rate is carried out by the rate determination module executing on the at least one hardware processor.

16. A computer program product for managing corrosion of a piece of equipment disposed in a building, the computer program product comprising a computer readable storage medium having computer readable program code embodied therewith, the computer readable program code comprising computer readable program code configured to perform the steps of:
- receiving first data relating corrosion rate to a plurality of environmental conditions;
- determining, by at least one hardware processor of the computer program product, a quantitative relationship between corrosion rate and the plurality of environmental conditions from the first data;
- receiving, from one or more corrosion sensors, second data indicative of one or more environmental conditions within the building;
- determining by the at least one hardware processor of the computer program product, a corrosion rate affecting the piece of equipment disposed in the building at least in part by applying the determined quantitative relationship to the second data; and
- modifying by the at least one hardware processor of the computer program product an aspect of an environmental control system of the building at least in part in response to the determined corrosion rate, wherein the environmental control system receives, directly, the determined corrosion rate and regulates the environmental conditions within the building using the determined corrosion rate.

17. An apparatus for managing corrosion of a piece of equipment disposed in a building, the apparatus comprising:
- a memory; and
- at least one processor, coupled to the memory, and operative to perform the steps of:
  - receiving first data relating corrosion rate to a plurality of environmental conditions;
  - determining a quantitative relationship between corrosion rate and the plurality of environmental conditions from the first data;
  - receiving, from one or more corrosion sensors disposed in the building, second data indicative of one or more environmental conditions at a plurality of locations within the building;
  - determining a corrosion rate affecting the piece of equipment disposed at one of the plurality of locations in the building at least in part by applying the determined quantitative relationship to the second data; and
  - modifying an aspect of an environmental control system of the building at least in part in response to the determined corrosion rate, wherein the environmental control system receives, directly, the determined corrosion rate and regulates the environmental conditions within the building using the determined corrosion rate.

18. The apparatus of claim 17, further comprising a plurality of distinct software modules, each of the distinct software modules being embodied on a computer-readable storage medium, and wherein the distinct software modules comprise a data acquisition module, an analysis module, and a rate determination module, wherein:
- the at least one processor is operative to perform the step of receiving the first data by executing the data acquisition module;
- the at least one processor is operative to perform the step of determining the quantitative relationship by executing the data analysis module; and
- the at least one processor is operative to perform the steps of receiving the second data and providing a corrosion rate by executing the rate determination module.

19. An apparatus for managing corrosion of a piece of equipment disposed in a building, the apparatus comprising:
- means for receiving first data relating corrosion rate to a plurality of environmental conditions;
- means for determining a quantitative relationship between corrosion rate and the plurality of environmental conditions from the first data;
- means for receiving second data indicative of one or more environmental conditions within the building;
- means for determining a corrosion rate affecting the piece of equipment disposed in the building at least in part by applying the determined quantitative relationship to the second data; and
- means for modifying an aspect of an environmental control system of the building at least in part in response to the determined corrosion rate, wherein the environmental control system receives, directly, the determined corrosion rate and regulates the environmental conditions within the building using the determined corrosion rate.

* * * * *